United States Patent [19]

Loughlin

[11] Patent Number: 4,479,233
[45] Date of Patent: Oct. 23, 1984

[54] DISTORTION CORRECTING AM STEREO RECEIVER WITH NON-FLAT AGC

[75] Inventor: Bernard D. Loughlin, Centerport, N.Y.

[73] Assignee: Hazeltine Corporation, Greenlawn, N.Y.

[21] Appl. No.: 354,332

[22] Filed: Mar. 3, 1982

[51] Int. Cl.³ .............................................. H04H 5/00
[52] U.S. Cl. ..................................................... 381/15
[58] Field of Search ................... 381/15, 16; 329/132, 329/135

[56] References Cited

U.S. PATENT DOCUMENTS

| | | | |
|---|---|---|---|
| 4,018,994 | 4/1977 | Kahn | 381/15 |
| 4,373,115 | 2/1983 | Kahn | 381/15 |
| 4,405,835 | 9/1983 | Jansen et al. | 381/15 |

Primary Examiner—R. J. Hickey
Attorney, Agent, or Firm—E. A. Onders; F. R. Agovino

[57] ABSTRACT

In a receiver for composite amplitude and angle modulated signals and having a non-flat automatic gain control characteristic, there is provided apparatus for providing distortion correction to the quadrature component produced by the angular modulation in accordance with the amplitude modulation component. In accordance with the invention, the output of an amplitude demodulator is modified to remove the carrier signal level dependent magnitude multiplier and develop a modification signal which is used to inversely amplitude modulate the quadrature signal component to provide distortion correction over a range of carrier signal levels. Such inverse modulation can be provided before or after quadrature demodulation of the received signal.

11 Claims, 5 Drawing Figures

DISTORTION CORRECTING AM STEREO RECEIVER WITH NON-FLAT AGC

BACKGROUND OF THE INVENTION

This invention relates to AM stereophonic receivers, and particularly to AM stereophonic receivers for receiving signals modulated according to the well known independent sideband (ISB) modulation technique. However, the invention is also useful in receivers for other composite amplitude and angular moduated stereo signals wherein a demodulated AM signal is used in conjunction with the angular modulation of such a composite signal for stereo reproduction.

U.S. Pat. No. 4,018,994 to Kahn describes an AM stereophonic receiver which includes an envelope detector, for detecting the amplitude modulation component of a received ISB AM stereo IF signal, and circuitry for detecting the quadrature modulation resulting from the phase modulation in the IF signal. The particular quadrature demodulation circuitry used by Kahn modifies the quadrature modulation component of the IF signal prior to quadrature detection for purposes of distortion correction.

In AM receivers, and particularly those with continuous tuning, it is often useful to have a non-flat automatic gain control (AGC) characteristic so that the signal level at the output of the envelope detector continuously increases with increasing received signal strength, rather than level off at some point. This characteristic is illustrated in FIG. 1, which is a graph of the output signal level from an envelope detector as a function of received signal level. If an ideal AGC circuit is used, the output signal level increases with increasing received signal level up to a certain level, and thereafter is flat as illustrated by curve 6 in FIG. 1. If no AGC is present, the output signal level increases linearly as a function of the input signal level as shown by curve 8 in FIG. 1. With a non-flat AGC circuit, the output signal level increases linearly with increasing input signal level up to a certain level, and thereafter increases at a lesser rate with respect to the input signal level, as shown by curve 7 in FIG. 1. A non-flat AGC characteristic is helpful to the operator of such a receiver in that tuning the receiver is easier, because the frequency at which maximum signal strength is received (i.e., the center of the band) is more easily sensed. Non-flat AGC also minimizes interstation noise and requires a lower value of maximum gain in a receiver's IF circuitry.

If a non-flat AGC characteristic is used in connection with an AM stereo receiver of the type described in the prior Kahn patent, which is illustrated in FIG. 2, the changing level A of the envelope detector output, corresponding to the carrier level at the detector (which is a function of tuning and received signal strength), will result in an improper correction signal being supplied to the inverse modulator 22 and, therefore, improper distortion correction. In FIG. 2, and elsewhere hereinafter, $X_+$ represents the stereo sum signal (L+R) and $X_-$ represents the stereo difference signal (L−R).

It is, therefore, an object of the present invention to provide a receiver which is generally of the distortion correcting type disclosed in the aforementioned Kahn patent, but which has a non-flat AGC characteristic.

SUMMARY OF THE INVENTION

The present invention is applicable in a receiver for receiving a signal having a carrier which has been amplitude modulated with a first modulating signal and angle modulated with a second modulating signal. In particular, the invention is applicable in a receiver wherein there are provided first means for demodulating such as composite signal to obtain a first demodulated signal representative of the first modulating signal and wherein the first demodulated signal has a signal level dependent on received carrier level. The receiver also includes second means for demodulating the composite signal to obtain a second demodulated signal representative of the quadrature modulation component produced by angular modulation of the carrier by the second modulating signal, the second demodulating means being responsive also to the first demodulated signal. In accordance with the invention, there is provided an improvement wherein the second demodulating means includes means responsive to the first demodulated signal for deriving therefrom a modification signal which is substantially independent of carrier signal level. The second demodulating means also includes means responsive to the modification signal for modifying the quadrature modulation component of the received signal thereby to derive the second demodulated signal.

The first demodulating means may comprise an envelope detector, in which case the first demodulated signal has a magnitude multiplier term which is dependent on the received carrier level. The means for deriving the modification signal may therefore comprise means for normalizing the first demodulated signal. The normalizing means in one case may be the series combination of a logarithmic amplifier and a high pass filter. The output of the logarithmic amplifier and high pass filter can thereafter be provided to a subtractive type inverse modulator for modifying the quadrature component of the received signal by acting on either the composite signal or the quadrature demodulated signal. In another case, the normalizing means may comprise the series combination of a low pass filter and a divider. In this case, the inverse modulator preferably comprises a reciprocal type inverse modulator. As noted previously, the invention is of particular advantage in receivers which have a non-flat AGC characteristic.

In accordance with another aspect of the invention, there is provided apparatus for receiving annd demodulating a composite AM stereo signal wherein a stereo sum signal is amplitude modulated on a carrier and a stereo difference signal is phase modulated on the carrier. The apparatus includes first means for amplitude demodulating the received composite signal to derive therefrom a first demodulated signal representative of the stereo sum signal and having a signal characteristic dependent on the carrier signal level of the composite signal. There is provided a second means which is responsive to the first demodulated signal, for deriving a modification signal having signal characteristics independent of the carrier signal level of the composite signal. Third means are provided which is responsive to the modification signal for modifying the quadrature modulation component of said composite signal.

In one embodiment, the second means comprises a logarithmic amplifier which is responsive to the first demodulated signal and has an output signal representative of the sum of a first logarithmic signal, which is proportional to the logarithm of the DC component of the first demodulated signal level, and a second logarithmic signal, which is representative of the stereo sum signal. A high pass filter is provided for removing the first logarithmic signal, whereby the modification signal comprises substantially only the second logarithmic signal. In this embodiment, the third means preferably comprises a subtractive type inverse modulator.

In another embodiment, the second means comprises a low pass filter for deriving the DC component of the first demodulated signal and a divider for dividing the first demodulated signal by the DC component, whereby the divider output comprises the desired modification signal. In this embodiment, the third means preferably comprises a reciprocal type inverse modulator.

In either of the above described embodiments the inverse modulator may be introduced either ahead of or following quadrature demodulation of the composite signal, so as to modify the quadrature modulation component of the signal.

For a better understanding of the present invention, together with other and further objects, reference is made to the following description, taken in conjunction with the accompanying drawings, and its scope will be pointed out in the appended claims.

DESCRIPTION OF THE INVENTION

Figure 2:
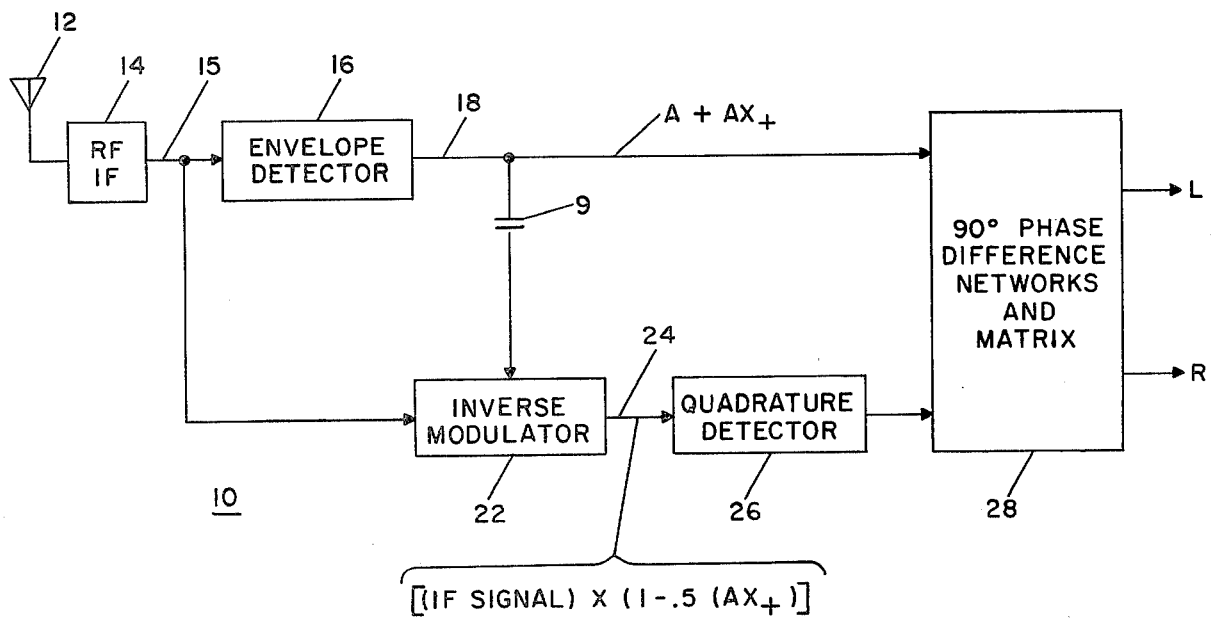
FIG. 2 is a block diagram of a composite signal receiver in accordance with the prior art.

Referring to FIG. 2, which illustrates in block diagram form a receiver according to the principles of Kahn U.S. Pat. No. 4,018,994, there is shown a receiver 10 for receiving and demodulating AM stereo signals, and particularly signals of the type known as independent sideband (ISB) AM stereo signals. This receiver is more fully described in the aforementioned Kahn patent, but will be reviewed for purposes of clarifying the nature and scope of the present invention.

Receiver 10 includes an antenna 12 and RF and IF circuits 14 which receive a composite amplitude and phase modulated AM stereo signal and provide a composite IF signal output on lead 15 which is supplied to a first demodulating means, comprising envelope detector 16, and a second demodulating means, comprising the combination of inverse modulator 22 and quadrature detector 26. The output of envelope detector 16 consists of a first demodulated signal $(A+AX_+)$ or $A(1+X_+)$ which is representative of a first modulating signal, the stereo sum signal $(X_+)$, which is amplitude modulated onto the carrier at the transmitter. Assuming that IF circuit 14 includes an AGC circuit which provides a non-flat AGC characteristic, such as that described previously herein with respect to curve 7 in FIG. 1, as a result, the envelope detector output includes a magnitude modifier (A) which is dependent on the carrier signal level of the received composite signal.

In accordance with the prior U.S. patent to Kahn, it is desirable to use the AC components of the demodulated signal, represented by $X_+$, for modifying the quadrature modulation component of the IF signal in inverse modulator 22 prior to supplying the modified IF signal to quadrature detector 26. The DC component, represented by (1) in the expression $(1+X_+)$, would normally be discarded by means of a series AC coupling capacitor 9.

Figure 1:
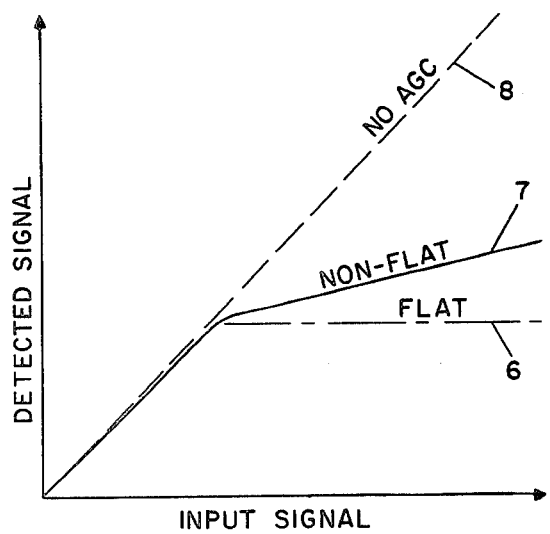
FIG. 1 is a graph illustrating detected signal output level as a function of input signal level for various AGC characteristics.

However, if the IF circuit 14 has a non-flat AGC characteristic such as curve 7 shown in FIG. 1, the amplitude of the modification signal supplied on lead 20 to inverse modulator 22 will vary according to the carrier level at envelope detector 16, which is a function of receiver tuning and received signal strength. As a result, the modified IF signal at the output of inverse modulator 22 will include the undesired magnitude modifier (A) which is a function of the carrier signal level. Accordingly, the signal at the output of quadrature detector 26 has improper distortion correction because of the presence undesired carrier level dependent magnitude modifier (A) in the modification signal supplied to inverse modulator 22. More particularly, the inverse modulation percentage may be the correct value to cancel the cross modulation distortion in the $X_-$ signal at only one carrier level (A), since the percent inverse modulation is dependent upon the carrier level (A).

The outputs of envelope detector 16 and quadrature detector 26 are supplied to 90 degree phase difference networks and a combining matrix, designated by block 28 in FIG. 2. The matrix in 28 develops separate left and right stereo signals L and R as fully described in the aforementioned Kahn patent.

As previously indicated, it is an object of the present invention to provide a receiver of the general type shown in FIG. 2 which includes distortion correction to the quadrature modulation component of the received signal and wherein the distrotion correction is substantially independent of carrier signal level at envelope detector 16. Various embodiments of such receivers are described herein with reference to FIGS. 3, 4 and 5.

Figure 3:
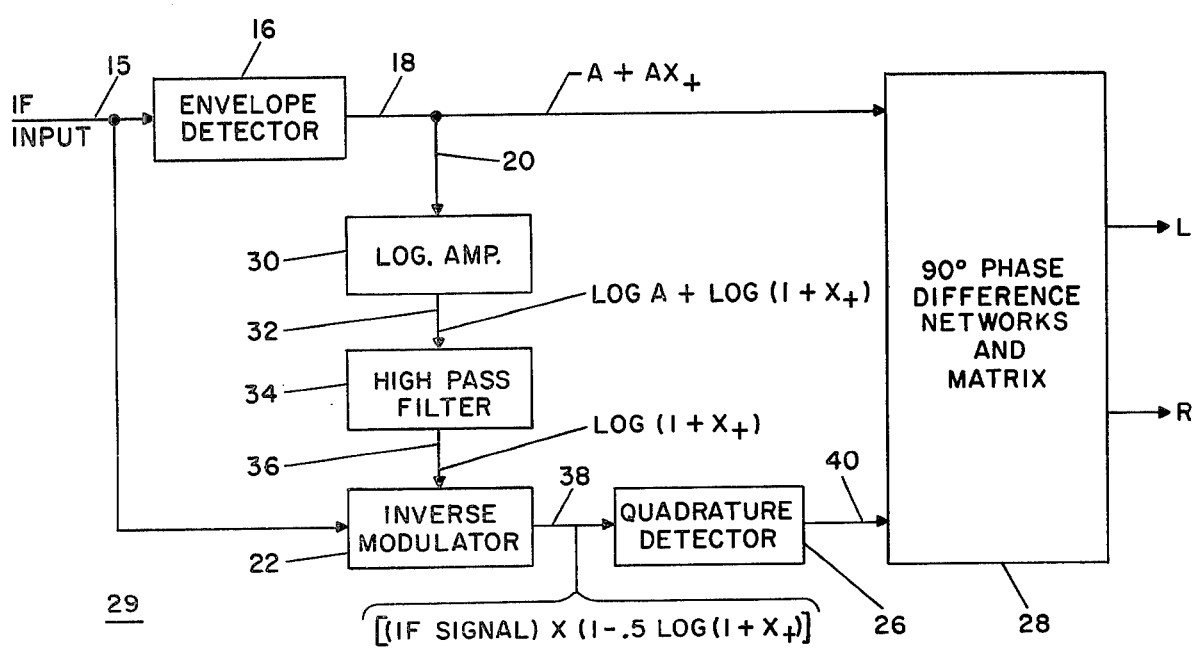
FIG. 3 is a block diagram of a composite signal demodulating apparatus usable in a receiver according to the present invention.

FIG. 3 illustrates demodulating apparatus 29 which provides distortion correction to the quadrature component of the received signal in a manner which is independent of received carrier signal level. Apparatus 29 may be used in conjunction with the same antenna 12 and RF and IF circuits 14 as are used in the receiver 10 of FIG. 2. The IF composite signal on lead 15 can reflect a non-flat AGC characteristic which, as previously mentioned, is desirable particularly for continuous-tuned AM receivers. The first demodulating means, envelope detector 16, provides an output on lead 18 to unit 28 which is a first demodulated signal $(A+AX_+)$ or $A(1+X_+)$, having a magnitude modifier (A) which is dependent on the received carrier signal level at the detector. This first demodulated signal is supplied to logarithmic amplifier 30 which provides an output signal on lead 32 that is the sum of a first logarithmic signal, $\log_E(A)$ which is representative only of the carrier signal level dependent modifier (A), and a second logarithmic signal, $\text{Log}_E(1+X_+)$ which is representative only of the stereo sum modulating signal $X_+$. This occurs because of the known mathematical relationship $\log(X)(Y) = \text{Log}(X) + \text{Log}(Y)$. Since the carrier signal level, and therefore the signal $\log_E(A)$, changes relatively slowly, it may be removed by high-pass filter 34 having a low-frequency cut-off of 5 Hz, for example, to develop an output modification signal on lead 36 which is representative substantially only of the stereo sum signal modulation, and is substantially independent of the received carrier signal level. This modification signal is shown as being applied to a substractive type inverse modulator 22, which is also supplied with the IF signal via lead 15. Subtractive type inverse modulator 22 has a transfer characteristic of (1−0.5B), for example, (where $B=\log_E(1+X_+)$) and modifies the IF signal to develop a modified IF signal which is supplied, via lead 38, to quadrature detector 26. The modification performed by substractive inverse modulator 22, using the logarithmic signal representative of the stereo sum modulating signal $X_+$, provides appropriate distortion correction to the quadrature modulation component of the IF signal prior to quadrature detection. Quadrature detector 26 demodulates the quadrature component of the modified IF signal to provide an output on lead 40 which is proportional to the stereo difference signal $X_-$ and has proper distortion correction. The stereo sum and difference representative signals present on leads 18 and 40, respectively, are then phase shifted and combined in the 90 degree phase difference networks and matrix unit 28 illustrated in FIG. 3 to derive separate left and right stereo signals.

The combination of the subtractive type inverse modulation function (1−0.5B) and the log function $B=\log_E(1+X_+)$ provides the equivalent of a reciprocal type inverse modulation function $1/(1+0.5X_+)$ When the log function has a magnitude which corresponds to the natural logarithm (i.e., $\log_E$), the first three terms in the expansion of $1/(1+0.5X_+)$ and of the function $1-0.5\log_E(1+X_+)$ are identical. Good correspondence (for example, within some close tolerance like ±a few percent) results over a somewhat greater range of $X_+$ values when the log function has a magnitude of 0.95 $\log_E$.

Figure 4:
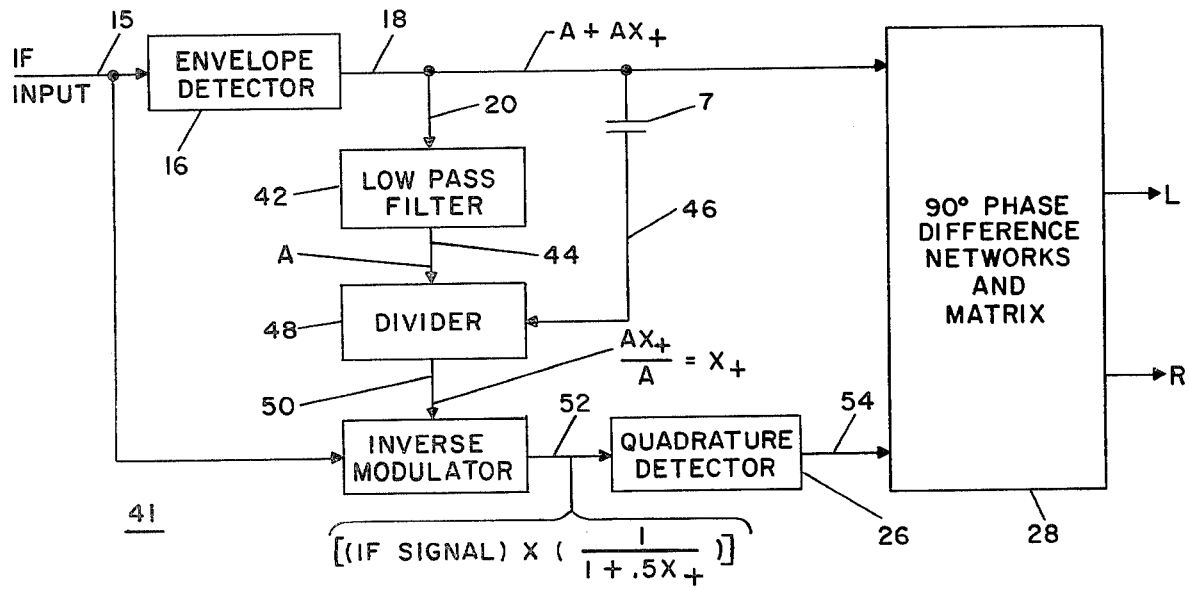
FIG. 4 is a block diagram of an laternative configuration of a composite signal demodulating apparatus usable in a receiver according to the present invention.

FIG. 4 is a block diagram of another demodulating apparatus 41 which provides for removal of the carrier signal level dependent modifier (A) from the output of envelope detector 16, thereby to develop a suitable modification signal for use in inverse modulator 22. In the demodulating apparatus 41 of FIG. 4, the output $(A+AX_+)$ of the first demodulator 16 is supplied to a low pass filter 42 having a high-frequency cut-off of 5 Hz, for example, whose output on lead 44 is a DC component representative of the term (A). The AC components $(AX_+)$ of the first demodulated signal are supplied via DC blocking capacitor 9 and lead 46 to divider 48 which divides the $(AX_+)$ term by the DC term (A) to derive a normalized signal $X_+$ which is representative of the sum stereo signal and is independent of carrier signal level. This signal is the modification signal which is supplied on lead 50 to inverse modulator 22. Inverse modulator 22 in this case is preferably a reciprocal type inverse modulator having a transfer characteristic of $1/(1+0.5X_+)$ for example, whereby proper distortion correction is provided to the quadrature modulation component of the IF signal supplied to inverse modulator 22 on lead 15. The resulting modified IF signal is supplied, via lead 52, to quadrature detector 26 to derive a second demodulated signal proportional to the stereo difference signal $X_-$ and having proper distortion correction. The first and second demodulated signals are then phase shifted and combined in the 90 degree phase difference networks and matrix unit 28 to derive separate left and right stereo signals.

Figure 5:
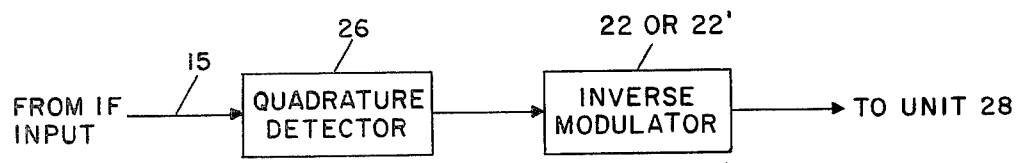
FIG. 5 is a block diagram illustrating an alternative arrangement for the embodiments shown in FIGS. 3 and 4.

It should be recognized that as an alternative the inverse modulation operation, which in the embodiments illustrated in FIGS. 3 and 4 is shown being performed on the IF signal prior to quadrature detection, can be performed equally as well on the output signal from the quadrature detector as shown in FIG. 5. In either case the desired distortion correction of the quadrature modulation component of the received signal is accomplished.

While there have been described what are believed to be the preferred embodiments of the present invention, those skilled in the art will recognize that other and further modifications may be made thereto without departing from the spirit of the invention, and it is intended to claim all such changes and modifications as fall within the true scope of the invention.

I claim:

1. In a receiver for receiving a composite signal having a carrier which has been amplitude modulated with a first modulating signal and angle modulated with a second modulating signal, wherein there are provided first means for demodulating said received signal to obtain a first demodulated signal representative of said first modulating signal, said first demodulated signal also having a characteristic which is dependent on the level of said carrier at said first means, and second means, jointly responsive to said received signal and to said first demodulated signal, for demodulating said received signal to obtain a second demodulated signal representative of said second modulating signal, but having distortion correction which is adversely affected by the carrier level dependency of said first demodulated signal, the improvement wherein said second demodulating means includes means responsive to said first demodulated signal for deriving therefrom a modification signal which is substantially independent of said carrier level, and means, jointly responsive to said modification signal and to said modulated carrier signal for developing therefrom a second demodulated signal which is representative of said second modulating signal and which has distortion correction that is substantially independent of said carrier level.

2. The improvement specified in claim 1 wherein said first demodulating means comprises an envelope detector and develops said first demodulated signal having a magnitude modifier term representative of said received carrier level.

3. The improvement specified in claim 2 wherein said means for developing said modification signal comprises the combination of a logarithmic amplifier and a high pass filter.

4. The improvement specified in claim 2 wherein said means for developing said modification signal comprises the combination of a low pass filter and a divider, and wherein said divider divides said first demodulated signal by the portion of said first demodulated signal present at the output of said low pass filter.

5. The improvement specified in any one of the claims 1 to 4 wherein said means ffor developing said second demodulated signal comprises an inverse amplitude modulator having a selected inverse modulation characteristic, and a quadrature demodulator.

6. A receiver for receiving and demodulating an AM stereo signal having a carrier amplitude modulated with a stereo sum signal and phase modulated with a stereo difference signal, comprising:

means for receiving said AM stereo signal and for converting it to a corresponding intermediate frequency (IF) signal;

first means for amplitude demodulating said IF signal to derive therefrom a first demodulated signal representative of said stereo sum signal and having a signal characteristic dependent on the level of said carrier at said first means;

second means, responsive to said first demodulated signal for deriving a modification signal having signal characteristics which are representative of said stereo sum signal and are substantially independent of said carrier level;

third means jointly responsive to said IF signal and to said modification signal for developing therefrom a second demodulated signal which is representative of said stereo difference signal and which has distortion correction that is substantially independent of said carrier level;

and fourth means for processing said first and second demodulated signals to derive a pair of stereo output signals.

7. A receiver as specified in claim 6 wherein said third means comprises an inverse amplitude modulator having a selected inverse modulation characteristic, and a quadrature detector.

8. A receiver as specified in claim 7 wherein said second means comprises means for logarithmically amplifying said first demodulated signal to develop an output signal representative of the sum of a first logarithmic signal, which is representative of the logarithm of the DC component of said first demodulated signal level, and a second logarithmic signal, which is representative of the AC components of said first demodulated signal, and a high pass filter for passing substantially only said second logarithmic signal thereby developing said modification signal.

9. A receiver as specified in claim 8 wherein said inverse modulator has a selected substractive type inverse modulation characteristic.

10. A receiver as specified in claim 7 wherein said second means comprises a low pass filter for deriving the DC component of said first demodulated signal, and a divider for dividing said first demodulated signal by the output of said low pass filter, thereby deriving said modification signal.

11. A receiver as specified in claim 10 wherein said inverse modulator has a selected reciprocal type inverse modulation characteristic.

* * * * *